US012755778B2

(12) United States Patent
Hamada et al.

(10) Patent No.: US 12,755,778 B2
(45) Date of Patent: Oct. 6, 2026

(54) MEMORY CIRCUITS WITH KEEPER CIRCUITS AND METHODS FOR OPERATING THE SAME

(71) Applicant: Taiwan Semiconductor Manufacturing Company, Ltd., Hsinchu (TW)

(72) Inventors: Masaya Hamada, Hsinchu City (TW); Makoto Yabuuchi, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 103 days.

(21) Appl. No.: 18/807,161

(22) Filed: Aug. 16, 2024

(65) Prior Publication Data

US 2026/0051350 A1 Feb. 19, 2026

(51) Int. Cl.
*G11C 11/412* (2006.01)
*G11C 11/418* (2006.01)
*G11C 11/419* (2006.01)

(52) U.S. Cl.
CPC .......... *G11C 11/418* (2013.01); *G11C 11/412* (2013.01); *G11C 11/419* (2013.01)

(58) Field of Classification Search
CPC .................................................... G11C 11/412
See application file for complete search history.

(56) References Cited

U.S. PATENT DOCUMENTS 6,081,130 A * 6/2000 Cao ...................... H03K 19/215 326/98
2003/0001623 A1* 1/2003 Alvandpour ....... H03K 19/0963 326/98
2012/0257443 A1 10/2012 Osada et al.
2013/0077397 A1 3/2013 Kurita et al.
2017/0069361 A1* 3/2017 Van Winkelhoff ....... G11C 7/12
2017/0352408 A1* 12/2017 Agarwal .................. G11C 5/14

OTHER PUBLICATIONS

Office Action issued in Taiwan Appl. No. 113147046 dated Nov. 10, 2025.

* cited by examiner

*Primary Examiner* — Hoai V Ho
(74) *Attorney, Agent, or Firm* — Foley & Lardner LLP

(57) ABSTRACT

A memory circuit includes a plurality of memory cells commonly coupled to a bit line. The memory circuit includes a pre-charge circuit coupled to the bit line, and comprising one or more first transistors with a first conductive type. The memory circuit includes a keeper circuit coupled to the bit line, and comprising one or more second transistors with a second conductive type.

20 Claims, 13 Drawing Sheets

MEMORY CIRCUITS WITH KEEPER CIRCUITS AND METHODS FOR OPERATING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
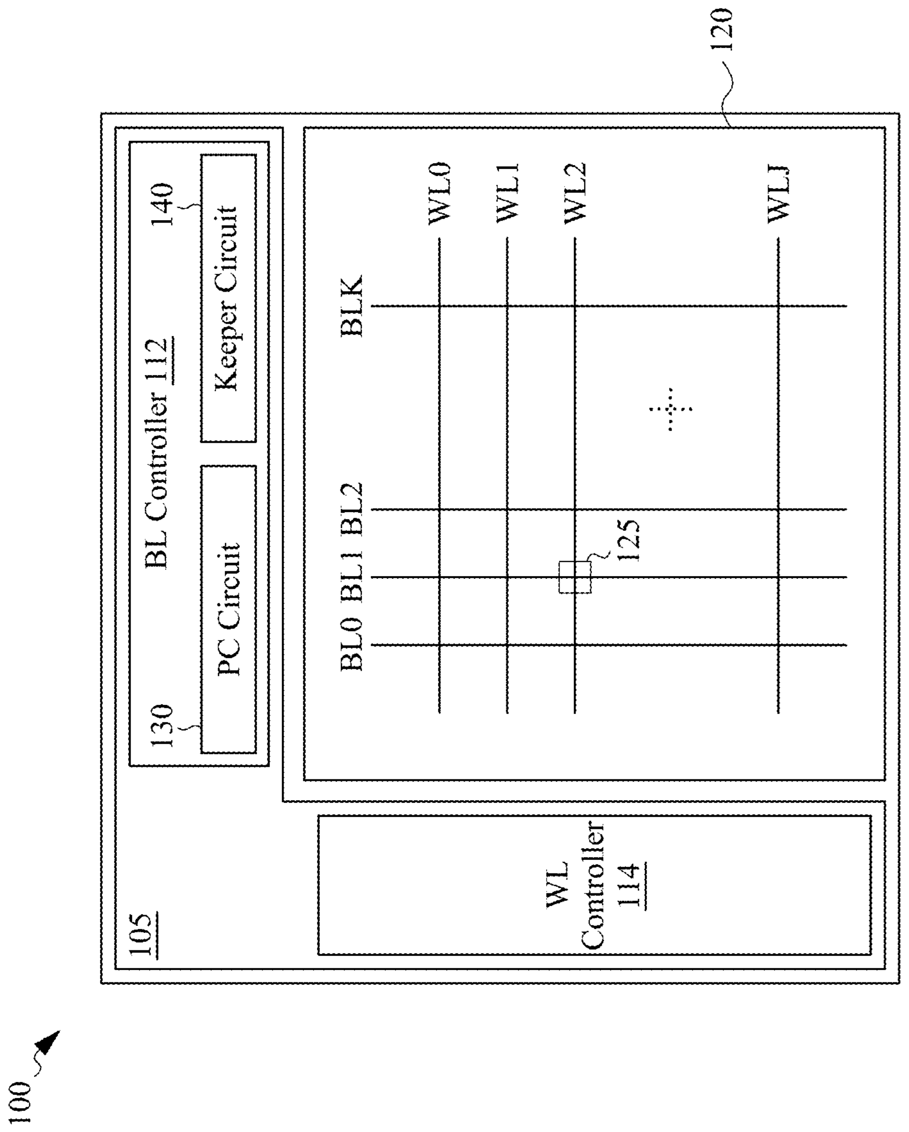
FIG. 1 illustrates a block diagram of a memory circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Static random access memory (SRAM) is a type of semiconductor memory typically used in computing applications requiring high-speed data access. For example, cache memory applications use SRAMs to store frequently-accessed data, e.g., data accessed by central processing units. The SRAM's cell structure and architecture enable the high-speed data access. The SRAM cell includes a bi-stable flip-flop structure and transistors that pass voltages from bit lines to the flip-flop structure. A typical SRAM architecture includes one or more arrays of memory cells and support circuitry. The memory cells of each SRAM array are arranged in rows and columns. Access to memory cells in a row is controlled by a word line. Data is transferred into (write operation) and out of (read operation) memory cells on bit lines. There is at least one bit line for each column of memory cells. The support circuitry includes address and driver circuits to access each of the SRAM cells—via the word lines and bit lines—for various SRAM operations.

In general, the SRAM cells are coupled to a keeper circuit that can assist in "keeping" bit lines charged to a voltage level if the bit lines are supposed to be charged to that voltage level. For example, when reading a logic 0 from an SRAM cell, the keeper circuit can keep the voltage level present on a bit line coupled to the SRAM cell to be substantially close to a voltage level corresponding to the logic 0; and when reading a logic 1 from an SRAM cell, the keeper circuit can keep the voltage level present on a bit line coupled to the SRAM cell to be substantially close to a voltage level corresponding to the logic 1. In the existing SRAM technologies, implementing such a keeper circuit typically requires a substantial number of p-type transistors, which can disadvantageously cause undesired area overhead. Accordingly, the existing memory circuits with a keeper circuit have not been entirely satisfactory in certain aspects.

The present disclosure provides various embodiments of a memory circuit that includes a memory array with a plural number of memory cells, and further includes a keeper circuit and a pre-charge circuit coupled to each bit line of the memory array. The keeper circuit is configured to keep a voltage level present on the bit line while accessing (e.g., reading) the corresponding memory cell, and the pre-charge circuit is configured to pre-charge the voltage level present on the bit line to a high logic state. In various embodiments, the keeper circuit can include one or more first transistors with a first conductive type, and the pre-charge circuit can include one or more second transistors with a second conductive type. By having the opposite conductive types, an area occupied by such peripheral circuits (e.g., the keeper and pre-charge circuits) can be better utilized, advantageously allowing less area overhead.

FIG. 1 illustrates a schematic diagram of a memory system or circuit 100, in accordance with various embodiments. The memory system 100 is implemented as an integrated circuit. As shown in the illustrated example of FIG. 1, the memory system 100 includes a memory controller 105 and a memory array 120. The memory array 120 may include a number of storage circuits, memory cells, memory bits, or bit cells 125 arranged in two-dimensional or three-dimensional arrays. Each of the memory cells 125 is accessible through a plural number of access lines. For example, each of the memory cells 125 may be connected to at least a corresponding word line WL and a corresponding pair of bit lines BL. Each of the word lines WL and bit lines BL may include any conductive (e.g., metal) material. For example, each of the word lines WL and bit lines BL can be implemented as one or more metal lines. The memory controller 105 may write data to or read data from the memory array 120 according to electrical signals through word lines WL and bit lines BL. In other embodiments, the memory system 100 includes more, fewer, or different components than shown in FIG. 1, while remaining within the scope of the present disclosure.

Figure 2:
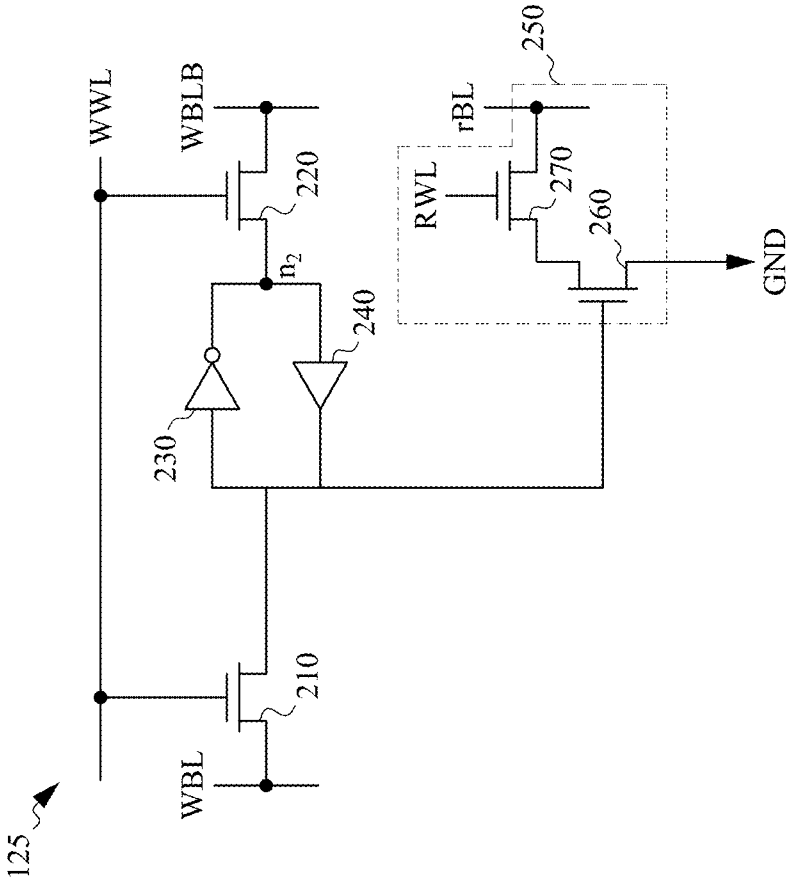
FIG. 2 illustrates a schematic diagram of a portion of the memory circuit of FIG. 1, in accordance with some embodiments.

The memory array 120 is a hardware component that stores data. In various embodiments, the memory array 120 is embodied as a semiconductor memory device. The memory array 120 includes a number of storage circuits or memory cells 125. In some embodiments, the memory array 120 includes word lines WL0, WL1 . . . WLJ, each extending in a first direction and bit lines BL0, BL1 . . . BLK, each extending in a second direction. The word lines WL and the bit lines BL may be conductive metals or conductive rails. Each memory cell 125 is connected to one or more corresponding word lines WL and one or more corresponding bit lines BL, and can be operated according to voltages or currents through the corresponding word line(s) WL and the corresponding bit line(s) BL. Each memory cell 125 may be a Static Random-Access Memory (SRAM) cell. For example, the memory cell 125 can be implemented as an eight-transistor (8T) SRAM cell, as shown in FIG. 2. However, it should be understood that the memory cell 125 can be implemented in any of various other memory configurations, while remaining within the scope of the present disclosure. In some embodiments, the memory array 120 includes additional lines (e.g., sense lines, reference lines, reference control lines, power rails, etc.).

The memory controller 105 is a hardware component that controls operations of the memory array 120. In some embodiments, the memory controller 105 includes a bit line controller 112 and a word line controller 114, in which the bit line controller can further include a pre-charge circuit 130 and a keeper circuit 140. In one configuration, the word line controller 114 is a circuit that provides a voltage or current signal through one or more word lines WL of the memory array 120. In one aspect, the bit line controller 112 is a circuit that provides a voltage or current signal through one or more bit lines BL of the memory array 120 and senses a voltage or current from the memory array 120 through the one or more bit lines BL. In various embodiments, the pre-charge circuit 130 can utilize a pre-charging signal to pre-charge the bit lines BL to a high logic state (e.g., VDD) during a phase when the memory array 120 is not being read or written; and the keeper circuit 140 can keep a voltage level present on the bit lines BL to its supposed voltage level when the memory array 120 is being read, by supplying a keeper current.

The bit line controller 112 may be connected to the bit lines BL of the memory array 120, and the word line controller 114 may be connected to the word lines WL of the memory array 120. In one example, to write data to a memory cell 125, the word line controller 114 is configured to apply a voltage or current signal (sometimes referred to as a WL signal) to the memory cell 125 through a corresponding word line WL connected to the memory cell 125, and the bit line controller 112 is configured to apply a voltage or current signal corresponding to data to be stored to the memory cell 125 through a pair of bit lines BL connected to the memory cell 125. To read data from a memory cell 125, the word line controller 114 is configured to apply a WL signal to the memory cell 125 through a corresponding word line WL connected to the memory cell 125, and the bit line controller 112 is configured to sense a voltage or current corresponding to data stored by the memory cell 125 through a bit line connected to the memory cell 125. In some embodiments, the memory controller 105 includes more, fewer, or different components than shown in FIG. 1, while remaining within the scope of the present disclosure.

FIG. 2 illustrates a schematic diagram of the memory cell 125 that is implemented as a two-port SRAM cell with eight transistors, in accordance with various embodiments. As mentioned above, the memory cell 125 is not limited to such an implementation, and can be implemented in any of various other configurations while remaining within the scope of the present disclosure.

In the illustrative example of FIG. 2, the memory cell 125 includes a pair of cross-coupled inverters 230 and 240, two pass gate transistors 210 and 220, and a read port 250. The inverters 230 and 240 are cross coupled between the nodes n1 and n2, and form a latch. The pass gate transistor 210 is coupled between a write bit line wBL and the node n1, and the pass gate transistor 220 is coupled between a complementary write bit line wBLB and the node n2, wherein the complementary write bit line wBLB is complementary to the write bit line wBL. The gates of the pass gate transistors 210 and 220 are coupled to the same write word line WWL. Furthermore, the pass gate transistors 210 and 220 are n-type transistors. The read port 250 includes the transistor 260 and a pass gate transistor 270. The transistor 260 is an n-type transistor, and is coupled between ground and the pass gate transistor 270. The gate of the transistor 260 is coupled to the node n1. The pass gate transistor 270 is coupled between a read bit line rBL and the transistor 260. The gate of the pass gate transistor 270 is coupled to the read word line RWL.

Before accessing the memory cell 125, the corresponding read bit line is pre-charged in pre-charge period. When the memory cell 125 is accessed for reading, the corresponding read word line RWL is activated and the data is read by detecting the logic level at the read bit line rBL coupled to the accessed memory cell 125. For example, when a low logic level (e.g. "0") is stored at the node n1 of the memory cell 125, the transistor 260 of memory cell 125 is turned off, e.g. acting as an open circuit. As a result, a high logic level (e.g. "1") is detected in the read bit line rBL when the memory cell 125 is accessed, i.e. a high logic level is read out. Conversely, if a high logic level is stored at the memory cell 125, the transistor 260 of the memory cell 125 is turned on, and the read bit line rBL is coupled to the ground via the transistor 260 and the pass gate transistor 270 of the memory cell 125. Thus, a low logic level is detected in the read bit line rBL when the memory cell 125 is accessed for reading, i.e. a low logic level is read out. In the embodiment, the data in the read bit line rBL is processed to reflect the data stored at the accessed memory cell 125, i.e. the data in the read bit line rBL is complementary to the data stored in the accessed memory cell 125. In some embodiments, the data of the read bit line rBL is identical to the data stored in the accessed memory cell 125.

Referring to FIG. 1 and FIG. 2 together, the pre-charge circuit 130 and the keeper circuit 140 can be commonly connected to the read bit line rBL. In some embodiments, the read bit line rBL is coupled to a plural number of the memory cells 125, with one of the memory cells 125 being selected for being read while others not being selected. During the read operation on the selected memory cell, the pre-charge circuit 130 may be deactivated, while the keeper circuit 140 is activated to keep the voltage level present on the read bit line rBL. For example, the keeper circuit 140 can provide a keeper current ($I_{kpr}$), that has a current level between a turned-off current of the non-selected memory cell ($I_{cell\_off}$) and a turned-on current of the selected memory cell ($I_{cell\_on}$), to keep the voltage level present on the read bit line rBL substantially close to the supposed voltage level.

Figure 3:
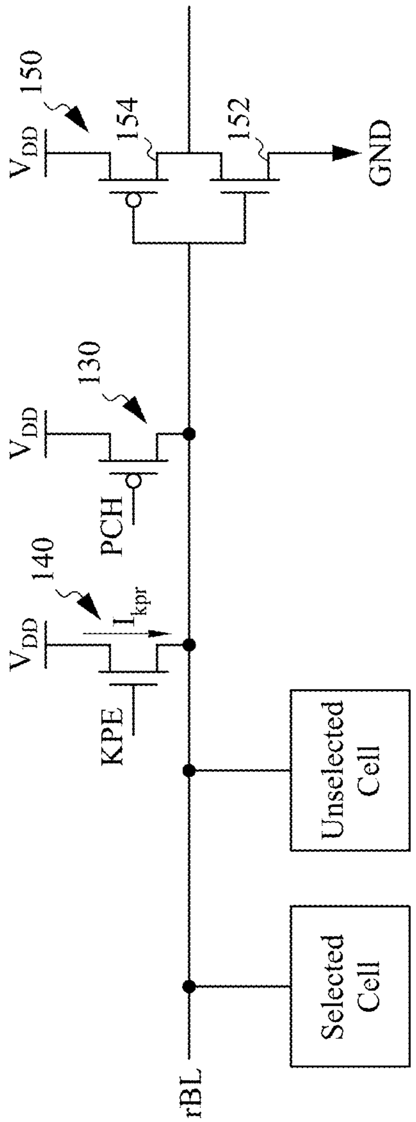
FIG. 3 illustrates another schematic diagram of a portion of the memory circuit of FIG. 1, in accordance with some embodiments.
Figure 4:
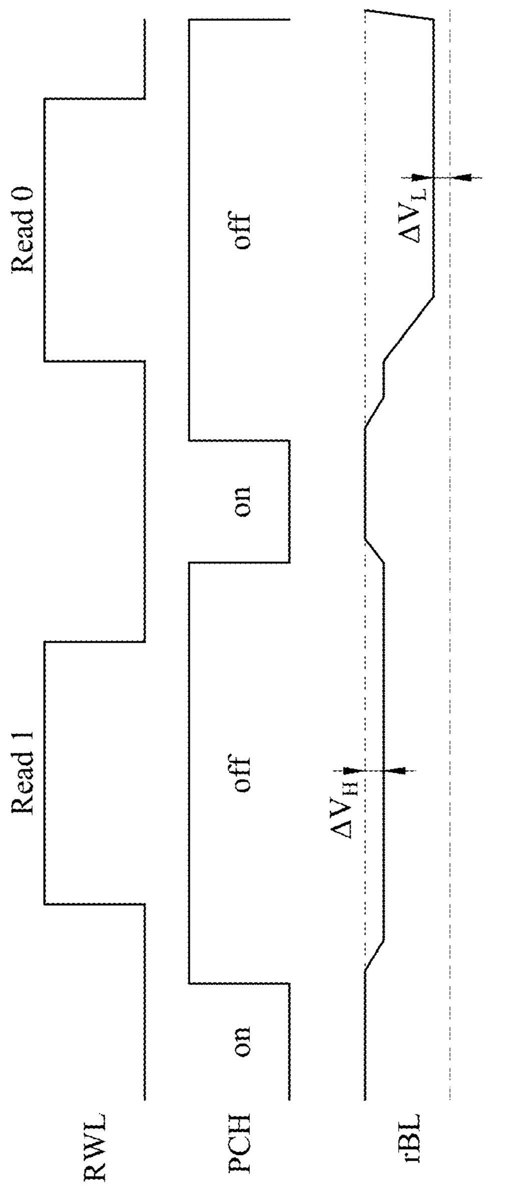
FIG. 4 illustrates waveforms of various signals when operating the memory circuit of FIG. 3, accordance with some embodiments.

FIG. 3 illustrates a schematic diagram of a portion of an example memory circuit that includes a read bit line rBL coupled to a selected memory cell and a non-selected memory cell, with the pre-charge circuit 130 and the keeper circuit 140 implemented as having different conductive types of transistors, in accordance with various embodiments. FIG. 4 illustrates example waveforms of several signals when operating the memory circuit of FIG. 3, in accordance with various embodiments.

As shown in FIG. 3, the pre-charge circuit 130 includes a p-type transistor, and the keeper circuit 140 includes an n-type transistor. In some embodiments, the p-type transistor of the pre-charge circuit 130 has its first source/drain terminal connected to VDD and its second source/drain terminal connected to the read bit line rBL, with its gate terminal connected to a pre-charging (PCH) signal; and the n-type transistor of the keeper circuit 140 has its first source/drain terminal connected to VDD and its second source/drain terminal connected to the read bit line rBL, with its gate terminal connected to a keeper (KPE) signal. The PCH signal may be pulled up to logic 1, when the selected memory cell is being read; and the KPE signal may be pulled up to logic 1, when the selected memory cell is being read. In some embodiments, the PCH signal and the KPE signal can be synchronized with each other, i.e., being pulled up/down at the same time. Accordingly, the pre-charge circuit 130 is deactivated during the read operation, while at the same time, the keeper circuit 140 is activated to supply a keeper current ($I_{kpr}$), which can be better appreciated in the waveforms of FIG. 4.

As illustrated in FIG. 4, during reading a logic 1 from the selected memory cell, a signal applied to the read word line RWL is asserted (e.g., pulled up) and the PCH signal is also pulled up; and during reading a logic 0 from the selected memory cell, the signal applied to the read word line RWL is asserted (e.g., pulled up) and the PCH signal is also pulled up. As such, the pre-charge circuit 130 may be deactivated during these reading periods. On the other hand, the keeper circuit 140 may be activated by the KPE signal during such periods. With the keeper circuit 140 being activated during either reading the logic 1 or 0 to supply the keeper current ($I_{kpr}$), it can be seen that the voltage level present on the read bit line rBL can be maintained close to a voltage level corresponding to the logic 1 or a voltage level corresponding to the logic 0.

In some embodiments, the read bit line rBL is coupled to an output inverter 150, which consists of an n-type transistor 152 and a p-type transistor 154 connected in series. Specifically, gate terminals of the n-type transistor 152 and the p-type transistor 154, which collectively serve as an input of the inverter 150, are connected to the read bit line rBL, and drain terminals of the n-type transistor 152 and the p-type transistor 154, which collectively serve as an output of the inverter 150. In some embodiments, a size of at least one of the n-type transistor 152 or the p-type transistor 154 may be larger than a size of any transistor forming the memory cell 125.

Figure 5:
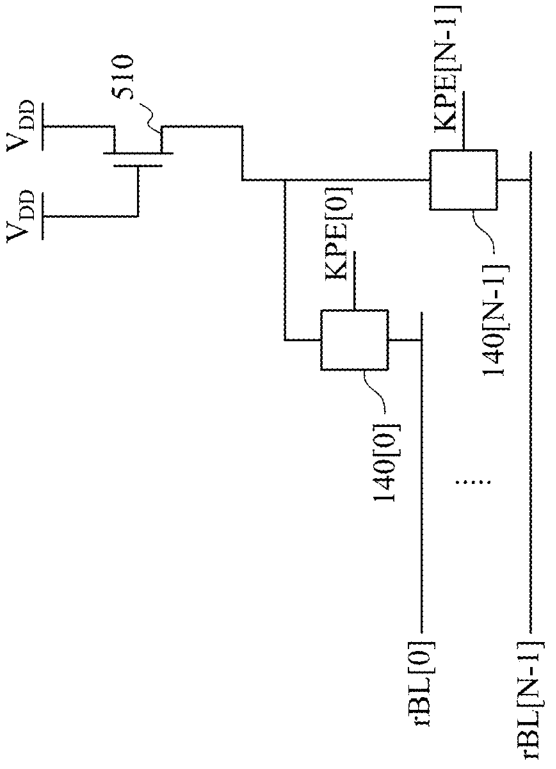
FIG. 5 illustrates yet another schematic diagram of a portion of the memory circuit of FIG. 1, in accordance with some embodiments.

FIG. 5 illustrates a schematic diagram of a portion of another example memory circuit that includes multiple read bit lines, e.g., rBL[0] . . . rBL[N−1], each of which is coupled to a respective number of memory cells, with a corresponding keeper circuit implemented in similar fashion to FIG. 3, in accordance with various embodiments. For example, the read bit line rBL[0] is coupled to a keeper circuit 140[0]; the read bit line rBL[N−1] is coupled to a keeper circuit 140[N−1]; and so on. Each of the keeper circuits 140[0] to 140[N−1] may include an n-type transistor with a gate terminal connected to a respective control signal, KPE. The keeper circuits 140[0] to 140[N−1] may be selectively activated, in accordance with the memory cell(s) connected to the corresponding read bit lines rBLs being selected. Further, the memory circuit of FIG. 5 may further include a common keeper circuit 510 coupled to the different keeper circuits 140[0] to 140[N−1]. In some embodiments, the common keeper circuit 510 can include an n-type transistor coupling VDD to one of the source/drain terminals of each of the keeper circuits 140[0] to 140[N−1]. Further, a gate terminal of the common keeper circuit 510 may be tied to VDD.

Figure 6:
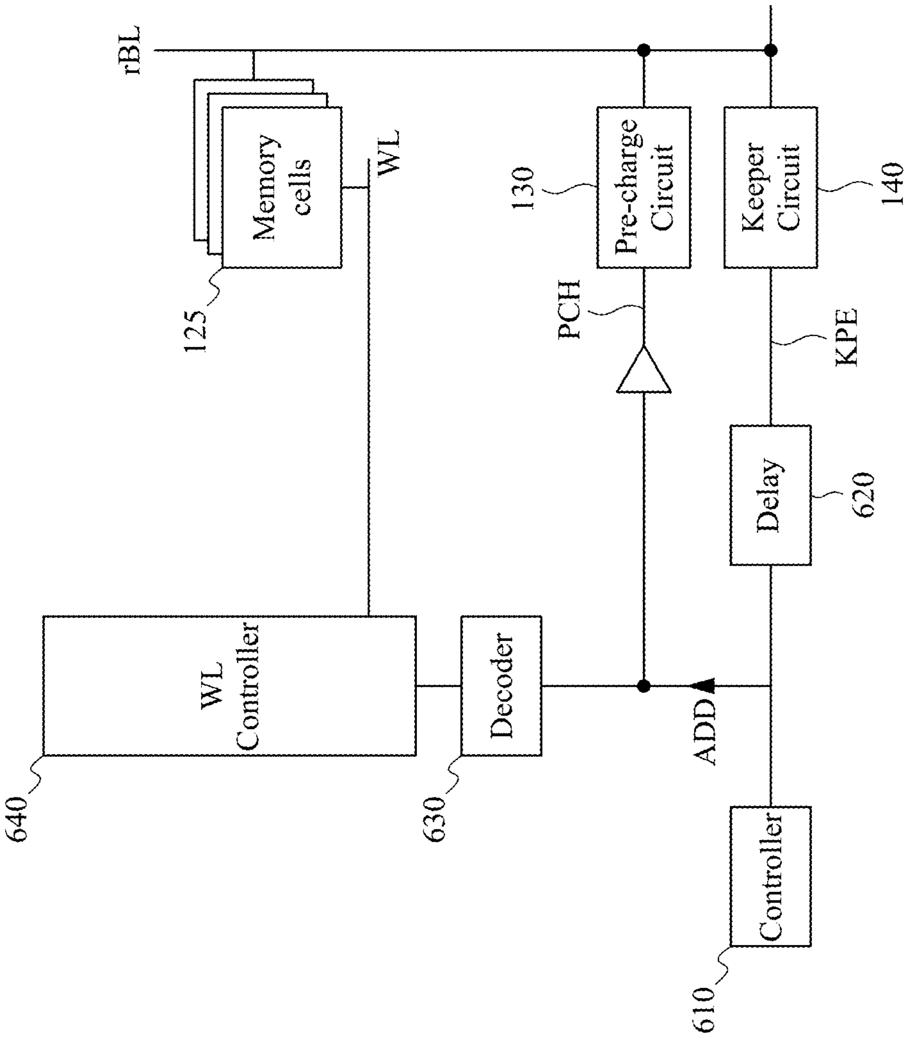
FIG. 6 illustrates yet another schematic diagram of a portion of the memory circuit of FIG. 1, in accordance with some embodiments.
Figure 7:
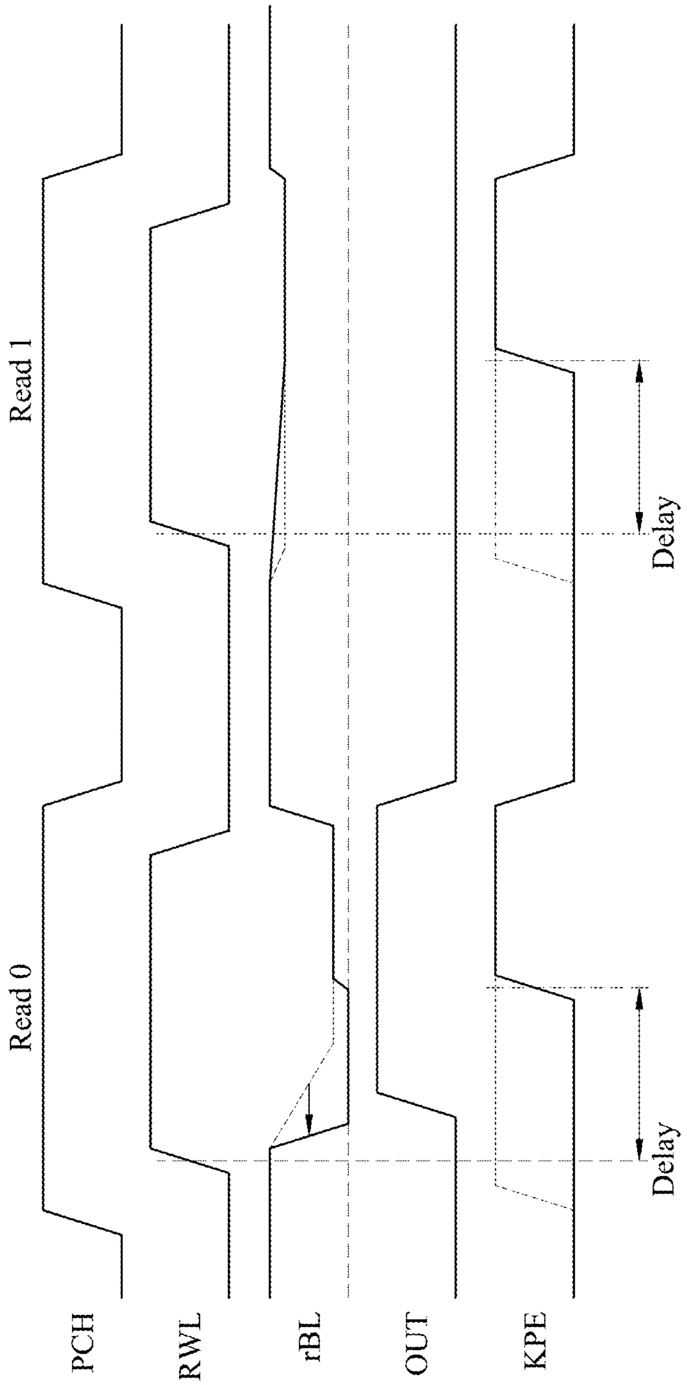
FIG. 7 illustrates waveforms of various signals when operating the memory circuit of FIG. 6, accordance with some embodiments.

FIG. 6 illustrates a schematic diagram of a portion of yet another example memory circuit that includes the pre-charge circuit 130 and the keeper circuit 140 connected to a read bit line rBL, in accordance with various embodiments. FIG. 7 illustrates example waveforms of several signals when operating the memory circuit of FIG. 6, in accordance with various embodiments.

As shown in FIG. 6, in addition to the pre-charge circuit 130 and the keeper circuit 140, a controller 610, a delay circuit 620, a decoder 630, and a WL controller 640 are coupled to the pre-charge circuit 130 and keeper circuit 140. Such components may be a part of the memory controller 105, shown in FIG. 1. In some embodiments, the controller 610 can provide the WL controller 640 with an address (ADD) signal specifying which of the memory cells 125 to be selected. The ADD signal can be provided to the WL controller 640 through the decoder 630. Further, the ADD signal can be provided to the pre-charge circuit 130 and the keeper circuit 140 as PCH signal and KPE signal, respectively. In some embodiments, the KPE signal can be delayed from the PCH signal by the delay circuit 620.

As illustrated in FIG. 7, during reading a logic 1 from the selected memory cell, a signal applied to the read word line RWL is asserted (e.g., pulled up) and the PCH signal is also pulled up; and during reading a logic 0 from the selected memory cell, the signal applied to the read word line RWL is asserted (e.g., pulled up) and the PCH signal is also pulled up. As such, the pre-charge circuit 130 may be deactivated during these reading periods. On the other hand, the keeper circuit 140 may be activated by the KPE signal during such periods, e.g., with slight delay. With the keeper circuit 140 being activated during either reading the logic 1 or 0 by pulling up the KPE signal, it can be seen that the voltage level present on the read bit line rBL can be maintained close to a voltage level corresponding to the logic 1 or a voltage level corresponding to the logic 0. Further, with the KPE signal delayed from the PCH signal, it can be assured that the transition of the signal present on the read bit line rBL does not change too fast (when compared to the dotted line where the KPE signal is not delayed).

Figure 8:
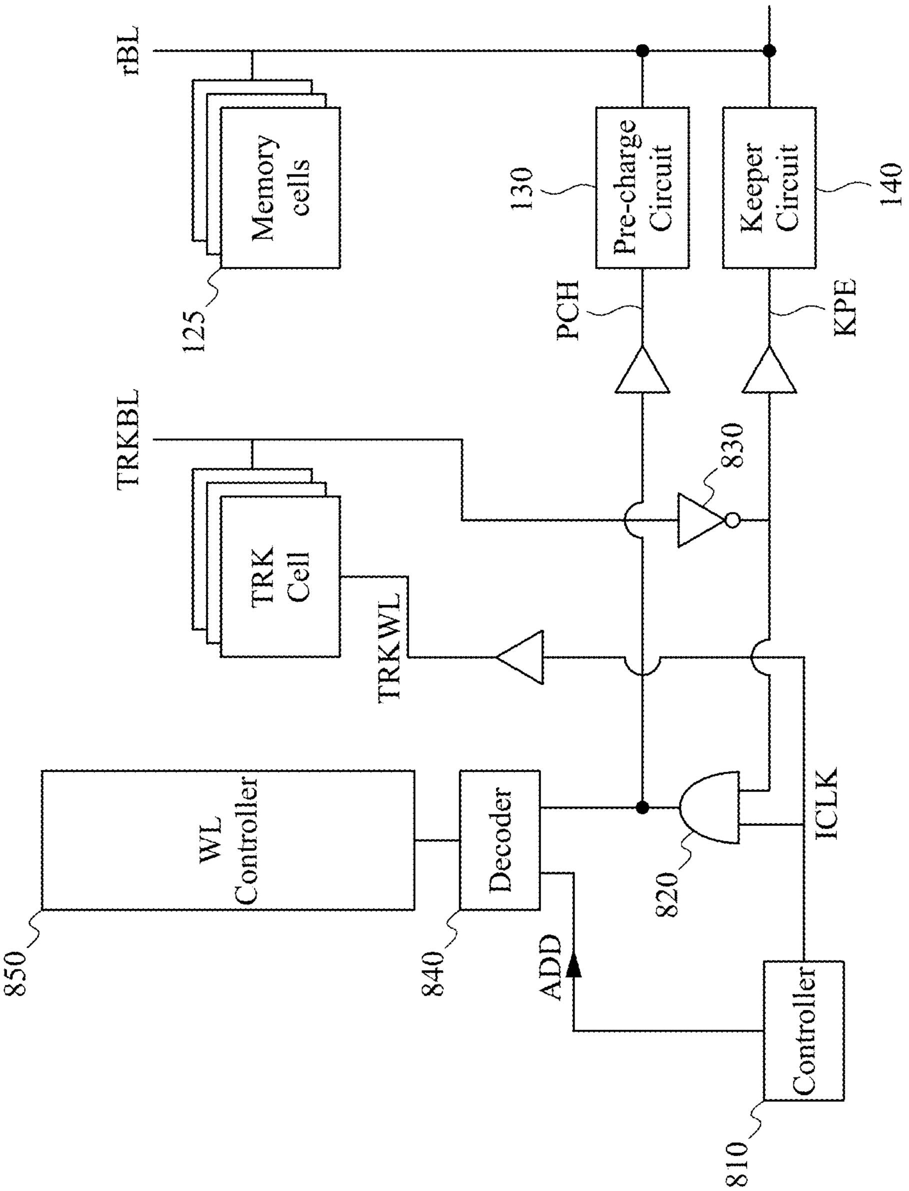
FIG. 8 illustrates yet another schematic diagram of a portion of the memory circuit of FIG. 1, in accordance with some embodiments.
Figure 9:
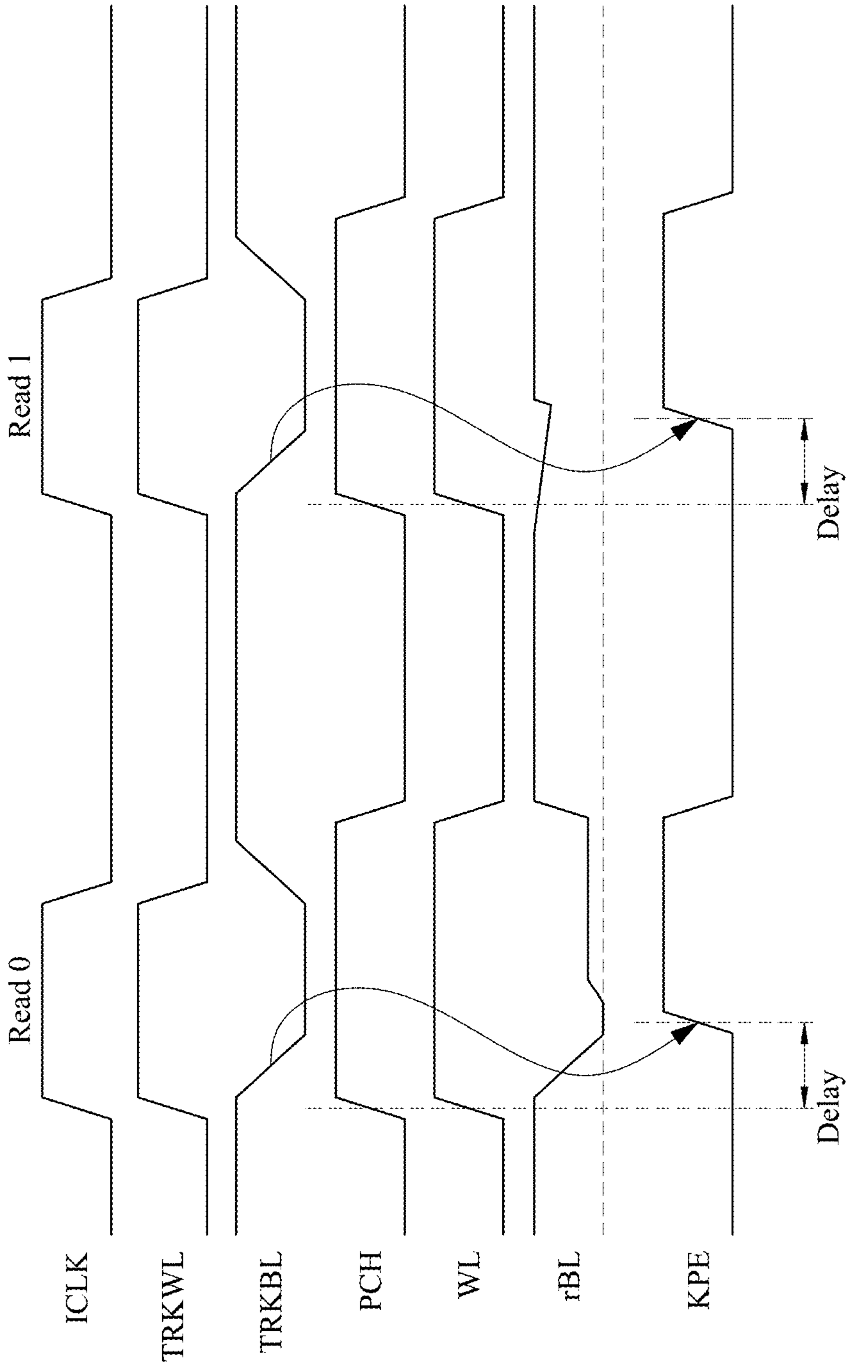
FIG. 9 illustrates waveforms of various signals when operating the memory circuit of FIG. 8, accordance with some embodiments.

FIG. 8 illustrates a schematic diagram of a portion of yet another example memory circuit that includes the pre-charge circuit 130 and the keeper circuit 140 connected to a read bit line rBL, in accordance with various embodiments. FIG. 9 illustrates example waveforms of several signals when operating the memory circuit of FIG. 8, in accordance with various embodiments.

As shown in FIG. 8, in addition to the pre-charge circuit 130 and the keeper circuit 140, a controller 810, a logic gate 820, an inverter 830, a decoder 840, a WL controller 850, and a number of tracking cells (with their corresponding tracking bit line and tracking word line) are coupled to the pre-charge circuit 130 and keeper circuit 140. The tracking cells are generally configured to mimic the behavior of the memory cells 125, and the tracking bit line (TRKBL) is configured to mimic an RC behavior of the read bit line rBL. Such components may be a part of the memory controller 105, shown in FIG. 1. In some embodiments, the controller 810 can provide the WL controller 850 with an address (ADD) signal specifying which of the memory cells 125 to be selected. The ADD signal can be provided to the WL controller 850 through the decoder 840. Concurrently with providing the ADD signal, the controller 810 can provide an internal clock (ICLK) signal to activate the tracking cells through the tracking word line. Based on the discharging status present on the tracking bit line, the keeper circuit 140 can be provided with KPE signal, while the pre-charge circuit 130 can receive PCH signal based on the ILCK signal. In some embodiments, the KPE signal can be delayed from the signal present on the tracking bit line.

As illustrated in FIG. 9, during reading a logic 0 from the selected memory cell, a signal applied to the read word line RWL is asserted (e.g., pulled up) and the PCH signal is also pulled up; and during reading a logic 1 from the selected memory cell, the signal applied to the read word line RWL is asserted (e.g., pulled up) and the PCH signal is also pulled up. As such, the pre-charge circuit 130 may be deactivated during these reading periods. On the other hand, the keeper circuit 140 may be activated by the KPE signal during such periods, e.g., with slight delay. With the keeper circuit 140 being activated during either reading the logic 1 or 0 by pulling up the KPE signal, it can be seen that the voltage level present on the read bit line rBL can be maintained close to a voltage level corresponding to the logic 1 or a voltage level corresponding to the logic 0. Further, with the KPE signal delayed from the voltage present on the tracking bit line (TRKBL), it can be assured that the any propagation delay present on the read bit line rBL can be tracked by the TRKBL. And the transition of the signal present on the read bit line rBL does not change too fast.

Figure 10:
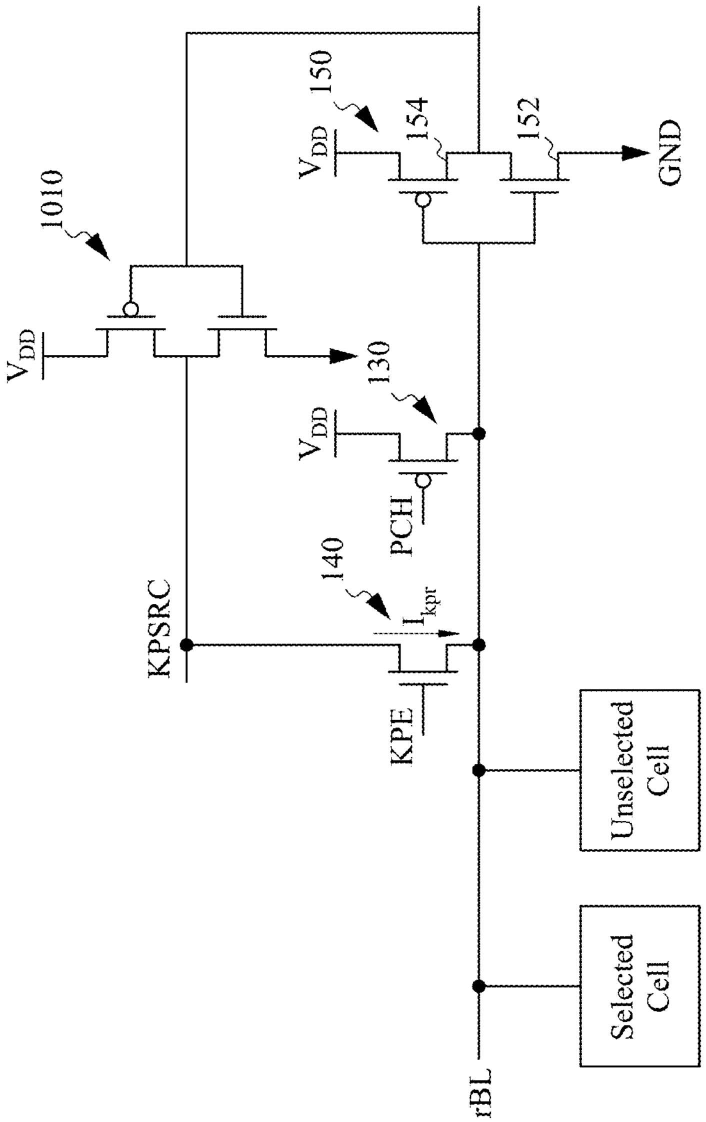
FIG. 10 illustrates yet another schematic diagram of a portion of the memory circuit of FIG. 1, in accordance with some embodiments.
Figure 11:
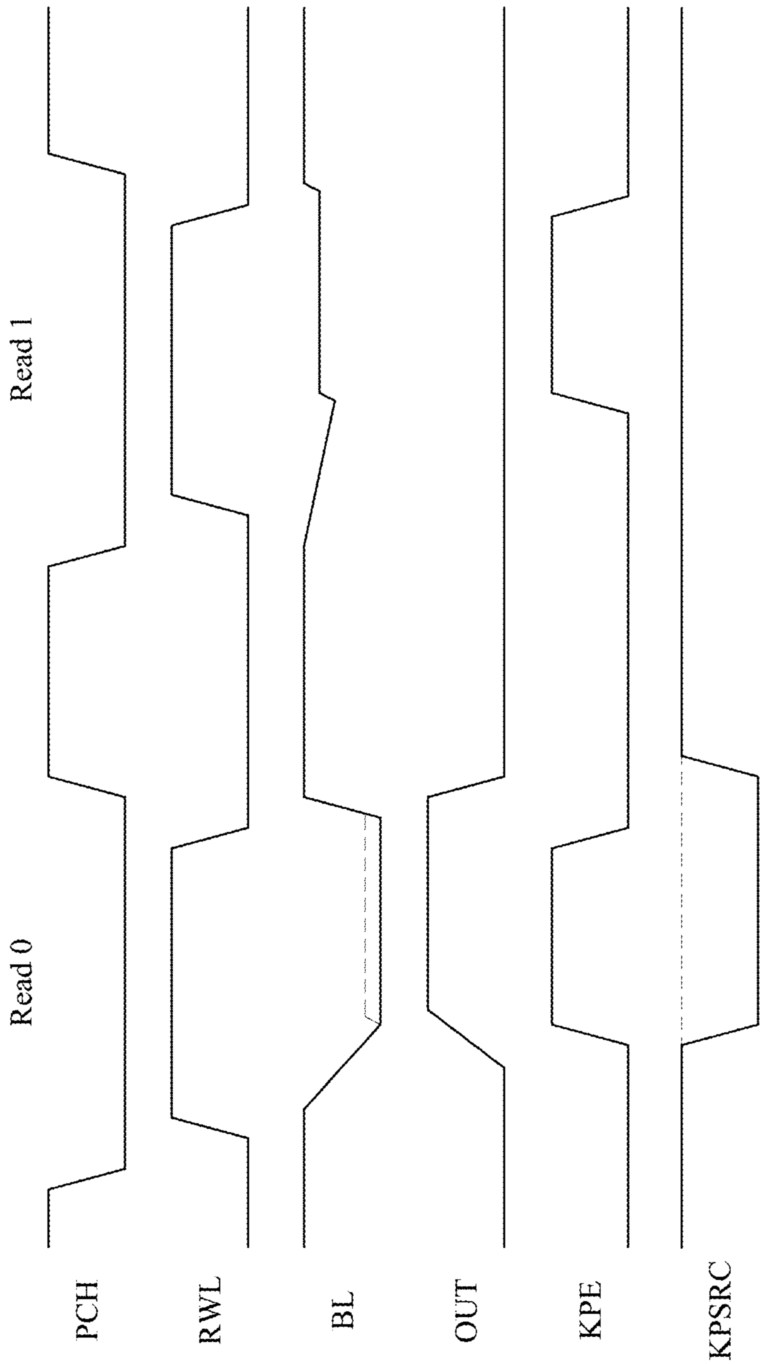
FIG. 11 illustrates waveforms of various signals when operating the memory circuit of FIG. 10, in accordance with some embodiments.

FIG. 10 illustrates a schematic diagram of a portion of yet another example memory circuit that includes a read bit line rBL coupled to a selected memory cell and a non-selected memory cell, with the pre-charge circuit 130 and the keeper circuit 140 implemented as having different conductive types of transistors, in accordance with various embodiments. FIG. 11 illustrates example waveforms of several signals when operating the memory circuit of FIG. 10, in accordance with various embodiments.

As shown in FIG. 10, the pre-charge circuit 130 includes a p-type transistor, and the keeper circuit 140 includes an n-type transistor. In some embodiments, the p-type transistor of the pre-charge circuit 130 has its first source/drain terminal connected to VDD and its second source/drain terminal connected to the read bit line rBL, with its gate terminal connected to a pre-charging (PCH) signal; and the n-type transistor of the keeper circuit 140 has its first source/drain terminal (KPSRC) coupled to the read bit line rBL through inverters 150 and 1010, and its second source/drain terminal connected to the read bit line rBL, with its gate terminal connected to a keeper (KPE) signal. In some embodiments, the PCH signal and the KPE signal can be synchronized with each other, i.e., being pulled up/down at the same time. Accordingly, the pre-charge circuit 130 is deactivated during the read operation, while at the same time, the keeper circuit 140 is activated to supply a keeper current ($I_{kpr}$). With the source/drain terminal (KPSRC) coupled to the read bit line rBL, the keeper current ($I_{kpr}$) provided by the keeper circuit 140 can be adjusted according to the logic state read from the selected memory cell.

As illustrated in FIG. 11, during reading a logic 1 from the selected memory cell, a signal applied to the read word line RWL is asserted (e.g., pulled up) and the PCH signal is also pulled up; and during reading a logic 0 from the selected memory cell, the signal applied to the read word line RWL is asserted (e.g., pulled up) and the PCH signal is also pulled up. As such, the pre-charge circuit 130 may be deactivated during these reading periods. On the other hand, the keeper circuit 140 may be activated by the KPE signal during such periods. With the keeper circuit 140 being activated during either reading the logic 1 or 0 to supply the keeper current ($I_{kpr}$), it can be seen that the voltage level present on the read bit line rBL can be maintained close to a voltage level corresponding to the logic 1 or a voltage level corresponding to the logic 0. Further, while reading the logic 0 from the memory cell, the voltage at the source/drain terminal (KPSRC) of the keeper circuit 140 can be pulled down (e.g., from the dotted line), which lowers the keeper current ($I_{kpr}$). Accordingly, the voltage level on the read bit line rBL can be kept low.

Figure 12:
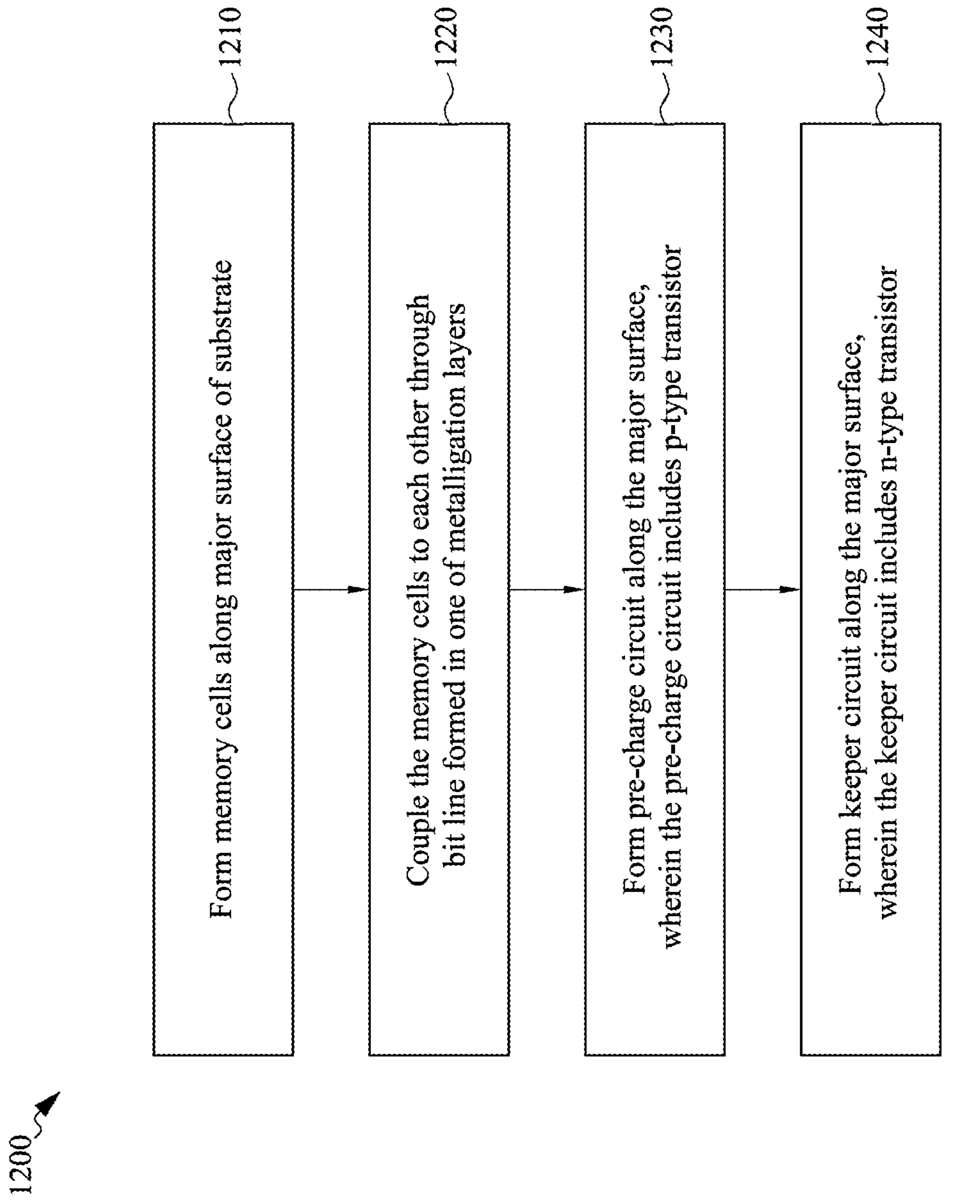
FIG. 12 illustrates a flow chart of a method for forming a memory circuit, in accordance with some embodiments.

FIG. 12 illustrates a flow chart of an example method 1200 for forming a memory circuit, in accordance with various embodiments. For example, at least some of the operations (or steps) of the method 1200 can be used to form a memory circuit discussed above. It is noted that the method 1200 is merely an example, and is not intended to limit the present disclosure. Accordingly, it should be understood that additional operations may be provided before, during, and/or after the method 1200 of FIG. 12, and that some other operations may only be briefly described herein.

The method 1200 starts with operation 1210 forming a plurality of memory cells along the major surface of a substrate. In some embodiments, the memory cells may each be formed of a respective number of transistors, e.g., a 6T SRAM cell, an 8T SRAM cell, etc. Such transistors formed along the major surface are generally referred to as a part of a front-end-of-line (FEOL) network or processing.

The substrate may be a semiconductor substrate, such as a bulk semiconductor, a semiconductor-on-insulator (SOI) substrate, or the like, which may be doped (e.g., with a p-type or an n-type dopant) or undoped. The substrate may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GainAs, GainP, and/or GainAsP; or combinations thereof.

The method 1200 continues to operation 1220 with forming a plurality of metallization layers over the major surface, at least one of which includes a bit line commonly coupled to the memory cells formed along the major surface. Such metallization layers formed above the major surface are generally referred to as a part of a back-end-of-line (BEOL) network or processing.

The method 1200 continues to operation 1230 with forming a pre-charge circuit along the major surface of the substrate, wherein the pre-charge circuit comprises a p-type transistor. In some embodiments, the pre-charge circuit is configured to pre-charge the bit line to a high logic state. For example, the p-type transistor of the pre-charge circuit can have a first source/drain terminal and a second source/drain terminal coupled to a power rail configured to provide a supply voltage (e.g., VDD) and the bit line, respectively. In some embodiments, the p-type transistor of the pre-charge circuit can have a gate terminal configured to receive a pre-charge (PCH) signal.

The method 1200 continues to operation 1240 with forming a keeper circuit along the major surface of the substrate, wherein the keeper circuit comprises an n-type transistor. In some embodiments, the keeper circuit is configured to keep a voltage level present on the bit line substantially close to a first voltage level when at least one of the memory cells storing a high logic state that corresponds to the first voltage level is being read, and substantially close to a second voltage level when the at least one memory cell storing a low logic state that corresponds to the second voltage level is being read. For example, the n-type transistor of the keeper circuit can have a first source/drain terminal and a second source/drain terminal coupled to the power rail configured to provide the supply voltage (e.g., VDD) and the bit line, respectively. In some embodiments, the n-type transistor of the keeper circuit can have a gate terminal configured to receive a keeper (KPE) signal.

Figure 13:
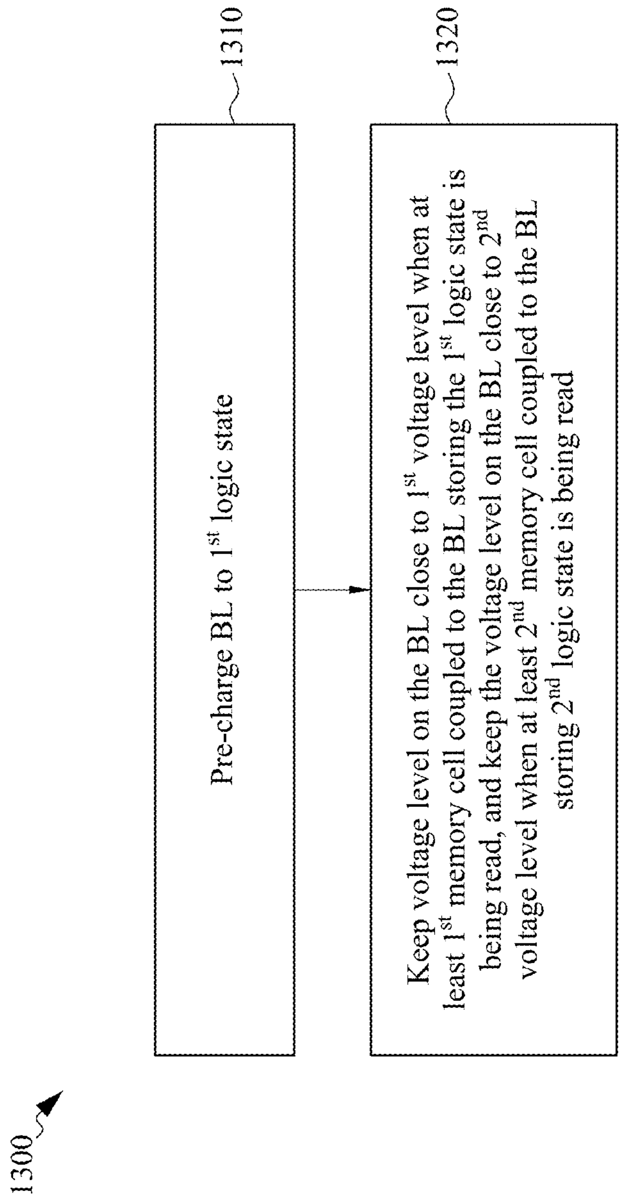
FIG. 13 illustrates a flow chart of a method of operating a memory circuit, in accordance with some embodiments.

FIG. 13 illustrates a flow chart of an example method 1300 for operating a memory circuit, in accordance with various embodiments. It is noted that the method 1300 is merely an example, and is not intended to limit the present disclosure. Accordingly, it should be understood that additional operations may be provided before, during, and/or after the method 1300 of FIG. 13, and that some other operations may only be briefly described herein.

The method 1300 starts with operation 1310 of pre-charging a bit line coupled to a plurality of memory cells to a first logic state. In some embodiments, a pre-charge circuit of the memory circuit (e.g., 130) can pre-charge the bit line to a logic high state that corresponds to a supply voltage (e.g., VDD). The pre-charge circuit can comprise a p-type transistor formed along the major surface of a substrate. For example, the p-type transistor of the pre-charge circuit can have a first source/drain terminal and a second source/drain terminal coupled to a power rail configured to provide the supply voltage and the bit line, respectively. In some embodiments, the p-type transistor of the pre-charge circuit can have a gate terminal configured to receive a pre-charge (PCH) signal.

The method 1300 proceeds to operation 1320 of keeping a voltage level present on the bit line substantially close to a first voltage level when at least a first one of the memory cells storing the first logic state that corresponds to the first voltage level is being read, and keeping the voltage level substantially close to a second voltage level when at least a second one of the memory cells storing a second logic state that corresponds to the second voltage level is being read. In some embodiments, a keeper circuit of the memory circuit (e.g., 140) can keep the voltage level on the bit line. The keeper circuit can comprise an n-type transistor formed along the major surface of the substrate. For example, the n-type transistor of the keeper circuit can have a first source/drain terminal and a second source/drain terminal coupled to the power rail configured to provide the supply voltage (e.g., VDD) and the bit line, respectively. In some embodiments, the n-type transistor of the keeper circuit can have a gate terminal configured to receive a keeper (KPE) signal.

In one aspect of the present disclosure, a memory circuit is disclosed. The memory circuit includes a plurality of memory cells commonly coupled to a bit line. The memory circuit includes a pre-charge circuit coupled to the bit line, and comprising one or more first transistors with a first conductive type. The memory circuit includes a keeper circuit coupled to the bit line, and comprising one or more second transistors with a second conductive type.

In another aspect of the present disclosure, a memory circuit is disclosed. The memory circuit includes a plurality of memory cells commonly coupled to a bit line. The memory circuit includes a pre-charge circuit coupled to the bit line and configured to pre-charge the bit line to a high logic state, while none of the memory cells is being read or written, wherein the pre-charge circuit comprises at least one p-type transistor. The memory circuit includes a keeper circuit coupled to the bit line and configured to keep a voltage level present on the bit line substantially close to a first voltage level when at least one of the memory cells storing a high logic state that corresponds to the first voltage level is being read, and substantially close to a second voltage level when the at least one memory cell storing a low logic state that corresponds to the second voltage level is being read, wherein the keeper circuit comprises at least one n-type transistor.

In yet another aspect of the present disclosure, a method for operating a memory circuit is disclosed. The method includes pre-charging a bit line coupled to a plurality of memory cells to a first logic state. The method includes keeping a voltage level present on the bit line substantially close to a first voltage level when at least a first one of the memory cells storing the first logic state that corresponds to the first voltage level is being read, and keeping the voltage level substantially close to a second voltage level when at least a second one of the memory cells storing a second logic state that corresponds to the second voltage level is being read.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., +10%, ±20%, or ±30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
- a plurality of memory cells commonly coupled to a bit line;
- a pre-charge circuit coupled to the bit line, and comprising one or more first transistors with a first conductive type; and
- a keeper circuit coupled to the bit line, and comprising one or more second transistors with only a second conductive type.

2. The memory circuit of claim 1, wherein the pre-charge circuit is configured to pre-charge the bit line to a high logic state, while none of the plurality of memory cells is being read or written.

3. The memory circuit of claim 1, wherein the keeper circuit is configured to keep a voltage level present on the bit line substantially close to a first voltage level when at least one of the plurality of memory cells storing a high logic state that corresponds to the first voltage level is being read, and substantially close to a second voltage level when at least one of the plurality of memory cells storing a low logic state that corresponds to the second voltage level is being read.

4. The memory circuit of claim 1, wherein
- the one or more first transistors of the pre-charge circuit include a p-type transistor coupling a supply voltage to the bit line; and
- the one or more second transistors of the keeper circuit include an n-type transistor coupling the supply voltage to the bit line.

5. The memory circuit of claim 4, wherein a gate terminal of the p-type transistor of the pre-charge circuit is connected to a pre-charge signal, and a gate terminal of the n-type transistor of the keeper circuit is connected to a keeper signal.

6. The memory circuit of claim 5, wherein the keeper signal and the pre-charge signal are synchronized with each other.

7. The memory circuit of claim 5, wherein the keeper signal is delayed from the pre-charge signal.

8. The memory circuit of claim 1, further comprising:
- an inverter coupled to the bit line, and comprising a third transistor and a fourth transistor connected in series;
- wherein a size of the third transistor or the fourth transistor is larger than a size of any of the one or more second transistors.

9. The memory circuit of claim 5, further comprising:
- a plurality of tracking cells commonly connected to a tracking bit line, the plurality of tracking cells configured to emulate the plurality of memory cells;
- wherein the keeper signal is delayed from a signal present on the tracking bit line.

10. The memory circuit of claim 4, wherein a drain terminal of the n-type transistor of the keeper circuit is connected to a signal present on the bit line.

11. A memory circuit, comprising:
- a plurality of memory cells commonly coupled to a bit line;
- a pre-charge circuit coupled to the bit line and configured to pre-charge the bit line to a high logic state, while none of the plurality of memory cells is being read or written, wherein the pre-charge circuit comprises at least one p-type transistor; and
- a keeper circuit coupled to the bit line and configured to keep a voltage level present on the bit line substantially close to a first voltage level when at least one of the plurality of memory cells storing a high logic state that corresponds to the first voltage level is being read, and substantially close to a second voltage level when at least one of the plurality of memory cells storing a low logic state that corresponds to the second voltage level is being read, wherein the keeper circuit comprises at least one n-type transistor, wherein the at least one n-type transistor is the only conductive type of transistor in the keeper circuit.

12. The memory circuit of claim 11, wherein the at least one p-type transistor is configured to couple a supply voltage to the bit line, and the at least one n-type transistor is configured to couple the supply voltage to the bit line.

13. The memory circuit of claim 11, wherein a gate terminal of the at least one p-type transistor of the pre-charge circuit is connected to a pre-charge signal, and a gate terminal of the at least one n-type transistor of the keeper circuit is connected to a keeper signal.

14. The memory circuit of claim 13, wherein the keeper signal and the pre-charge signal are synchronized with each other.

15. The memory circuit of claim 13, wherein the keeper signal is delayed from the pre-charge signal.

16. The memory circuit of claim 13, further comprising:
- a plurality of tracking cells commonly connected to a tracking bit line, the plurality of tracking cells configured to emulate the plurality of memory cells;
- wherein the keeper signal is delayed from a signal present on the tracking bit line.

17. The memory circuit of claim 11, wherein a drain terminal of the at least one n-type transistor of the keeper circuit is connected to a signal present on the bit line.

18. A method, comprising:
- pre-charging a bit line coupled to a plurality of memory cells to a first logic state by a pre-charge circuit; and
- keeping a voltage level present on the bit line substantially close to a first voltage level by a keeper circuit comprising at least one transistor of only a first conductive type when at least a first one of the plurality of memory cells storing the first logic state that corresponds to the first voltage level is being read, and keeping the voltage level substantially close to a second voltage level by the keeper circuit when at least a second one of the plurality of memory cells storing a second logic state that corresponds to the second voltage level is being read.

19. The method of claim 18, wherein the plurality of memory cells are formed along a major surface of a substrate, the pre-charge circuit comprises a p-type transistor formed along the major surface, and the keeper circuit comprises an n-type transistor formed along the major surface.

20. The method of claim 18, wherein the pre-charge circuit is configured to couple a supply voltage to the bit line, and the keeper circuit is configured to couple the supply voltage to the bit line.

* * * * *